(12) United States Patent
Matsuki

(10) Patent No.: US 6,527,847 B1
(45) Date of Patent: Mar. 4, 2003

(54) COATING COMPOSITION

(75) Inventor: Yasuo Matsuki, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/701,377

(22) PCT Filed: Mar. 29, 2000

(86) PCT No.: PCT/JP00/01960

§ 371 (c)(1),
(2), (4) Date: Nov. 30, 2000

(87) PCT Pub. No.: WO00/58409

PCT Pub. Date: Oct. 5, 2000

(30) Foreign Application Priority Data

Mar. 30, 1999 (JP) .............................. 11-088541
Mar. 30, 1999 (JP) .............................. 11-088542

(51) Int. Cl.$^7$ ............................................ C09D 183/00

(52) U.S. Cl. ................................. 106/287.1; 106/285

(58) Field of Search ............................... 106/282.1, 285

(56) References Cited

U.S. PATENT DOCUMENTS

| | | | |
|---|---|---|---|
| 3,379,512 | A | 4/1968 | Margrave et al. |
| 4,695,331 | A | 9/1987 | Ramaprasad |

FOREIGN PATENT DOCUMENTS

| | | |
|---|---|---|
| EP | 0 233 613 | 8/1987 |
| GB | 2 077 710 | 12/1981 |
| JP | 64-29661 | 1/1989 |
| JP | 2-101463 | 4/1990 |
| JP | 2-251135 | 10/1990 |
| JP | 2-266525 | 10/1990 |
| JP | 4-334551 | 11/1992 |
| JP | 7-267621 | 10/1995 |

OTHER PUBLICATIONS

CAPLUS 1990–523893, "Silicon–containing conductive polymer resist and fine pattern formation", Abstract of JP 02–101463, Hashimoto et al. Apr, 1990.*

J.R. Dahn, et al., J. Appl. Phys., vol. 75, No. 4, pp. 1946–1951, "X–Ray Diffraction and X–Ray Absorption Studies of Porous Silicon, Siloxene, Heat–Treated Siloxene, and Layered Polysilane", (Feb. 15, 1994).

Uwe Versteeg, et al., Journal of Computational Chemistry, vol. 15, No. 10, pp. 1151–1162, "The Valence Isomers of $(CH)_8$ and $(SiH)_8$: An Ab Initio Mo Study", 1994 No month provided.

Werner Kern, et al., J. Vac. Sci. Technol., vol. 14, No. 5, pp. 1082–1099, "Advances in Deposition Processes for Passivation Films", (Sep./Oct. 1977).

W.E. Spear, et al., Solid State Communications, vol. 17, No. 9, pp. 1193–1196, "Substitutional Doping of Amorphous Silicon", 1975 No month provided.

Patricia A. Bianconi, et al., J. Am. Chem. Soc., vol. 110, No. 7, pp. 2342–2344, "Poly (n–Hexylsilyne): Synthesis and Properties of the First Alkyl Silicon $[RSi]_n$ Network Polymer", 1988 No month provided.

Kazuaki Furukawa, et al., Macromolecules, vol. 23, No. 14, pp. 3423–3426, "Optical Properties of Silicon Network Polymers", 1990 No month provided.

Koichi Mikami, et al., J. Chem. Soc., Chem. Commun., pp. 1161–1163, "Anomalous Threo–Diastereoselectively in Allylic Silane–OR Stannane–Aldehyde Condensation Reactions: New Interpretation of the Antiperiplanar vs. Synclinal Problem on the Transition–State Conformations", 1990 No month provided.

Tatsuya Shono, et al., J. Chem. Soc., Chem. Commun., pp. 896–897, "Electroreductive Synthesis of Polygermane and Germane–Silane Copolymer", 1992 No month provided.

Kenkichi Sakamoto, et al., Macromolecules, vol. 23, No. 20, pp. 4494–4496, "Highly Ordered High Molecular Weight Alternating Polysilylene Copolymer Prepared by Anionic Polymerization of Masked Disilene", 1990 No month provided.

E. Hengge, et al., Z. Anorg. Allg. Chem., vol. 459, pp. 123–130, "Darstellung Und Charakterisierung Von Cyclohexasilan $Si_6H_{12}$", 1979 No month provided.

E. Hengge, et al., Monatshefte fuer Chemie, vol. 106, pp. 503–512, "Darstellung Und Eigenschaften Von Cyclopentasilan", 1975 No month provided.

Harald Stueger, et al., Z. Anorg. Allg. Chem., vol. 621, pp. 1517–1522, "Anorganische Bi(Cyclopentasilanyle): Synthese Und Spektroskopische Charakterisierung", 1995 No month provided.

Philip Boudjouk, et al., J. Chem. Soc., Chem. Commun., pp. 777–778, "The Synthesis of the First Spiropentasilane, Octanethylsiropentasilane", 1984 No month provided.

* cited by examiner

Primary Examiner—David Brunsman
(74) Attorney, Agent, or Firm—Oblon, Spivak, McClelland, Maier & Neustadt, P.C.

(57) ABSTRACT

A coating composition comprising a silicon compound represented by the following formula (1):

$$Si_n X^1{}_n \qquad (1)$$

wherein $X^1$ is a hydrogen atom or a halogen atom, and n is an integer of 4 or more, on the proviso that n occurrences of $X^1$ may be the same as or different from one another, or a modified silane compound represented by the following formula (2):

$$Si_n X^2{}_m Y_l \qquad (2)$$

wherein $X^2$ is a hydrogen atom or a halogen atom, Y is a boron atom or a phosphorus atom, n is an integer of 3 or more, l is an integer of 1 or more, and m is an integer of n to 2n+3, on the proviso that m occurrences of $X^2$ may be the same as or different from one another, and solvent thereof. This coating composition is suitably used in the production of a device for forming a silicon film or a boron- or phosphorous-doped silicon film on a substrate having a large area.

9 Claims, 2 Drawing Sheets

COATING COMPOSITION

This application is a 371 PCT/JP00/01960, filed Mar. 29, 2000.

TECHNICAL FIELD

This invention relates to a coating composition containing a specific silicon compound. More specifically, it relates to a coating composition containing an elementary silicon that has been imparted with excellent semiconducting properties by heat treatment or irradiation of light or a silicon compound that can be converted into a modified silicon film as used in LSI, thin-film transistor, photoelectric converter, photosensitive body and the like.

PRIOR ARTS

To form an amorphous silicon film and a polysilicon film, thermal CVD (Chemical Vapor Deposition), plasma CVD, photo CVD or the like of a monosilane gas or a disilane gas has been used heretofore. In general, thermal CVD (refer to J. Vac. Sci. Technology., vol. 14, p.1,082(1977)) has been widely used for polysilicon, while plasma CVD (refer to Solid State Com., vol. 17, p.1,193(1975)) has been widely used for amorphous silicon, and they are used in the production of a liquid crystal display device that has a thin-film transistor and a solar cell.

However, further improvements have been anticipated in the formation of the silicon film by these CVD's in view of the following points regarding processing; that is, (a) since it is a gas phase reaction, the generation of silicon particles in a gas phase causes the contamination of an apparatus or the inclusion of foreign matters, thereby causing low production yield, (b) since the material is in gaseous form, it is difficult to form a film having a uniform thickness on a substrate whose surface is not smooth, (c) productivity is low because the formation of the film is slow, and (d) complicated and expensive radio-frequency generator and vacuum apparatus are required in the case of plasma CVD.

Further, since gaseous silicon hydride which is highly toxic and highly reactive is used as the material, it is not only difficult to handle but also requires a sealed vacuum apparatus since it is in gaseous form. In general, these apparatus are not only bulky and expensive but also consume a large amount of energy in a vacuum or plasma system, causing an increase in product cost.

In recent years, a process of coating of liquid silicon hydride without using the vacuum system has been proposed to overcome the above inconvenience. Japanese Patent Laid-Open Publication No. 1-29661-A discloses a process comprising liquefying a gaseous material to have the material adsorbed to a cooled substrate and reacting the material with chemically active elementary hydrogen to form a thin silicon film. This process, however, has some points to be improved in that a complicated apparatus is required because the gasification and subsequent cooling of silicon hydride as the material are conducted in succession and that it is difficult to control the thickness of the film.

Further, Japanese Patent Laid-Open Publication No. 7-267621-A discloses a process comprising coating low-molecular-weight liquid silicon hydride on a substrate. This process has such problems that the system is difficult to handle because it is unstable and that it is difficult to obtain a uniform film thickness when the silicon hydride is applied to a substrate having a large area because it is in liquid form.

Meanwhile, an example of a solid silicon hydride polymer has been reported in GB-2,077,710A. This polymer, however, cannot be used for forming a film by coating since it is insoluble in a solvent.

Further, to form a silicon film pattern, there has been frequently used a process comprising forming a silicon film all over a substrate by the above vacuum film-formation process and forming a desired pattern by photolithography and etching. However, this process has such defects that it has too many steps for forming a device across a large area and that it raises production costs because of the use of expensive apparatus and a variety of materials and the consumption of a large amount of energy.

Further, the above silicon semiconductor film is generally doped by the elements of the third group and the fifth group of the periodic table and used as a positive or negative semiconductor. The doping is generally carried out by thermal diffusion or ion injection after the formation of the silicon film. Since the doping is carried out in a vacuum process control thereof is complicated, and it is particularly difficult to form a uniformly doped silicon film on a large substrate.

DISCLOSURE OF THE INVENTION

It is an object of the present invention to provide a novel coating composition.

It is another object of the present invention to provide a coating composition containing a silicon compound soluble in a solvent, which can give elementary silicon imparted with excellent semiconducting properties by heat treatment or irradiation of light.

It is still another object of the present invention to provide a coating composition for producing a device capable of forming a film from a silicon compound (precursor) by coating and converting the silicon precursor to a silicon semiconductor by subjecting the silicon compound film to heat treatment and/or optical treatment in an inert atmosphere, particularly in the production of a device forming a silicon film on a substrate of large area.

It is still another object of the present invention to provide a coating composition containing a silicon precursor, which can form a silicon film at low cost and in a stable manner by an energy-efficient process without conducting the conventional vacuum film formation.

It is still another object of the present invention to provide a coating composition that can be suitably used in the process for producing a device that forms a boron- or phosphorus-doped silicon film particularly on a substrate of large area.

It is still another object of the present invention to provide a coating composition for forming a film from the modified silane compound, which can be suitably used in a process to enable forming a film comprising a modified silane compound as a silicon precursor film by coating and then converting the silicon precursor film to a silicon semiconductor by subjecting the silicon precursor film to heat treatment and/or optical treatment in an inert atmosphere while doping the silicon precursor film.

Still other objects and advantages of the present invention will be apparent from the following description.

According to the present invention, firstly, the above objects and advantages of the present invention are achieved by a coating composition (will be sometimes referred to as "the first coating composition of the present invention" hereinafter) comprising a silicon compound represented by the following formula (1):

$$Si_n X^1_n \quad (1)$$

wherein $X^1$ is a hydrogen atom or a halogen atom, and n is an integer of 4 or more, on the proviso that n occurrences of $X^1$ may be the same as or different from one another, and solvent thereof.

Further, according to the present invention, secondly, the above objects and advantages of the present invention are achieved by a coating composition (will be sometimes referred to as "the second coating composition of the present invention" hereinafter) comprising a modified silane compound represented by the following formula (2):

$$Si_n X^2_m Y_l \tag{2}$$

wherein $X^2$ is a hydrogen atom or a halogen atom, Y is a boron atom or a phosphorus atom, n is an integer of 3 or more, l is an integer of 1 or more, and m is an integer of n to 2n+3, on the proviso that m occurrences of $X^2$ may be the same as or different from one another, and solvent thereof.

Figure 1:
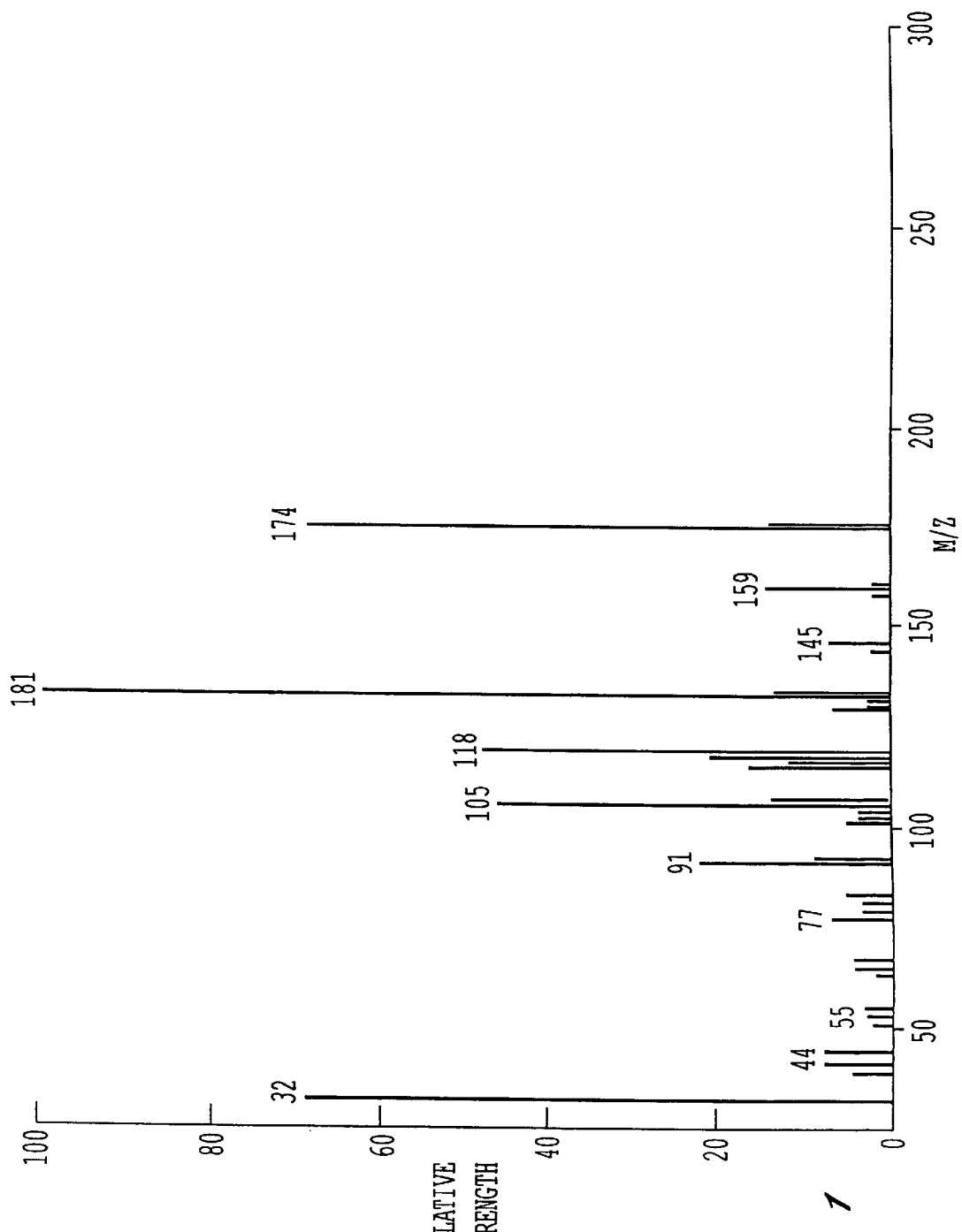
FIG. 1 shows the mass spectrum of the main component obtained in Synthesis Example 1 of the present invention.

A detailed description will be given to the first coating composition of the present invention hereinafter.

The first coating composition of the present invention contains the silicon compound represented by the above formula (1). In the above formula (1), $X^1$ is a hydrogen atom or a halogen atom, and n is an integer of 4 or more. In this case, n occurrences of $X^1$ may be the same as or different from one another. In view of the thermodynamic stability, solubility and ease of purification of a cyclic silicon compound, a polycyclic silicon compound with n of about 4 to 14 is preferable. When n is smaller than 4, a multiple aggregate of silicon atoms becomes thermodynamically unstable, whereby the polycyclic silicon compound becomes difficult to handle. On the other hand, when n is larger than 14, a decrease in solubility attributed to the cohesion of the silicon compound can be recognized, whereby the number of solvents that can be selected becomes smaller.

Further, since the polycyclic silicon compound is a precursor compound that is to be eventually converted into elementary silicon by heat treatment and/or optical treatment, silicon-hydrogen bonds and silicon-halogen bonds thereof are cleaved by the above treatment(s) to form silicon-silicon bonds, whereby the compound is eventually converted into elementary silicon. As the halogen atom, fluorine, chlorine, bromine and iodine atoms are preferable, and of these, chlorine and bromine are more preferable in view of the aforementioned cleavage of the bond. $X^1$ may be a hydrogen atom, a halogen atom, or a partially halogenated cyclic silicon compound in which the total number of hydrogen atoms and halogen atoms is n.

Illustrative examples of the silicon compound represented by the above formula (1) include hydrogenated polycyclic silicon compounds represented by the following structural formulas.

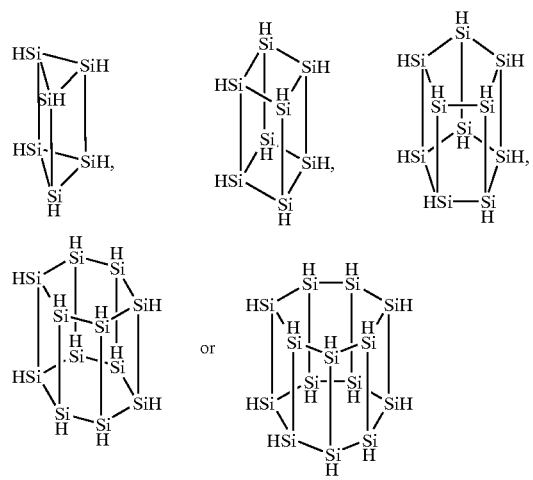

These hydrogenated polycyclic silicon compounds may be used in admixture of two or more.

The polycyclic silicon compound used in the present invention can be generally synthesized by forming silicon-silicon bonds using monomers having their own structural units as raw materials. To form the silicon-silicon bonds, there can be used the following processes, that is, (a) a process comprising polycondensing halosilanes by dehalogenation in the presence of an alkali metal (i.e., "Kipping process", refer to J. Am. Chem. Soc., 110, 124(1988) and Macromolecules, 23, 3423(1990)), (b) a process comprising dehalogenating a halogenated silane compound by electrolytic reduction to polycondense the compound (refer to J. Chem. Soc., Chem. Commun., 1161(1990) and J. Chem. Soc., Chem. Commun., 897(1992)), (c) a process comprising polycondensing hydrosilanes by dehydrogenation in the presence of a metal catalyst (refer to Japanese Patent Laid-Open Publication No. 4-334551-A), (d) a process comprising anionic polymerizing biphenyl-crosslinked disilane (refer to Macromolecules, 23, 4494(1990)), and (e) a process comprising synthesizing a phenyl- or alkyl-substituted cyclic silicon compound by the above processes and deriving hydro-substitution product or halogen-substitution product thereof by conventional processes (for example, Z. Anorg. All. Chem., 459, 123–130(1979)). Further, these halogenated cyclosilane compounds can be synthesized by conventional processes (i.e., E. Hengge, et al., Mh. Chem. 106, 503, (1975)), and by optimizing the synthesis condition, chlorinated compounds, hydrogenated compound and partially chlorinated compounds can be used.

The first coating composition of the present invention comprises a solution obtained by dissolving the above polycyclic silicon compound in a solvent. The solvent that is used in the present invention preferably has a boiling point of 30 to 350° C. under atmospheric pressure. When the boiling point of the solvent is lower than 30° C., the solvent is liable to evaporate before the formation of a film by coating, thereby making it difficult to form a good coating film. On the other hand, when the above boiling point is higher than 350° C., since the solvent takes longer time to dry, the solvent is liable to remain in the coating film of the polycyclic silicon compound, thereby making it difficult to obtain a silicon film of good quality even after the subsequent heat treatment and/or optical treatment.

The solvent used in the present invention can be any solvent that dissolves the polycyclic silicon compound and does not react with the polycyclic silicon compound. Illustrative examples of the solvent include hydrocarbon solvents such as n-pentane, n-hexane, n-heptane, n-octane, n-decane, dicyclopentane, benzene, toluene, xylene, durene, indene, tetrahydronaphthalene, decahydronaphthalene and squalane; ether solvents such as diethyl ether, dipropyl ether, ethylene glycol dimethyl ether, ethylene glycol diethyl ether, ethylene glycol methylethyl ether, diethylene glycol dimethyl ether, diethylene glycol diethyl ether, diethylene glycol methylethyl ether, tetrahydrofuran, tetrahydropyran, bis(2-methoxyethyl) ether, p-dioxane and tetrahydrofuran; aprotic polar solvents such as propylene carbonate, γ-butyrolactone, N-methyl-2-pyrrolidone, dimethyl formamide, acetonitrile, dimethyl sulfoxide, methylene chloride and chloroform. Of these, hydrocarbon solvents and ether solvents are preferable from the viewpoints of the solubility of the polycyclic silicon compound and the stability of the solution, hydrocarbon solvents are more preferable. These solvents can be used solely or in admixture of two or more.

The first coating composition of the present invention comprises the above polycyclic silicon compound as a solute and the solvent as described above and has excellent uniformly coating properties. The concentration of the solute is preferably about 1 to 80 wt % and can be adjusted as appropriate according to a desired coating process and a desired silicon film thickness. To these solutions, a fluoride-based, silicone-based or nonionic surface tension regulator can be added as required in such a small amount that does not impair the objects and functions of the present invention. The thus-prepared cyclic silicon compound solution, which is the first coating composition of the present invention, preferably has a viscosity of 1 to 500 mPa·s. When the viscosity is smaller than 1 mPa·s, coating is difficult to carry out, while when it is larger than 500 mPa·s, coating is also difficult to carry out.

As a technique for coating the first coating composition of the present invention, spin coating, dip coating, spray coating, roll coating, curtain coating and ink-jet coating can be employed, for example. They may be used in combination as required. The atmosphere under which the first coating composition of the present invention is coated by the above techniques is preferably an inert gas such as argon, helium or nitrogen, and the coating temperature can be selected as appropriate from room temperature to about 100° C. according to the rheological properties of the materials of the solution.

The substrate on which the first coating composition of the present invention is coated is not particularly limited in kind. As the substrate, there can be used a substrate made of glasses such as quartz, borosilicate glass and soda glass; plastics such as polyethylene terephthalate and polyphenylene sulfide; or metals such as gold, silver, copper, nickel, iron, titanium, aluminum, tungsten and silicon. A variety of glass, plastic and metal substrates of which surfaces are covered with these metals can also be used as the substrate.

The polycyclic silicon compound film obtained by coating the first coating composition of the present invention is first dried and then subjected to heat treatment and/or optical treatment to be converted into an elementary silicon film. These treatments are preferably carried out in an atmosphere of an inert gas such as nitrogen, argon or helium, and a small amount of reducing gas such as hydrogen may be mixed in the atmosphere as required. The heat treatment is carried out for the purposes of removing the solvent from the coating film and converting the polycyclic silicon compound film into the elementary silicon film after the coating, and the conditions therefor are determined as appropriate by the boiling point of the solvent and the thermal behavior of the cyclic silicon compound and are not particularly limited. For example, the heat treatment is carried out at temperatures of about 100 to about 800° C., preferably about 200 to about 600° C., more preferably about 300 to about 500° C., in an argon atmosphere. It can be carried out by dividing the heat treatment condition into multiple steps.

The silicon material on which the coating film of the cyclic silicon compound represented by the above formula (1) in the present invention has been formed is subjected to optical treatment in an inert gas atmosphere after the solvent is removed therefrom by the above heat treatment. The solvent-soluble cyclic silicon compound is converted into not only a solvent-insoluble and strong coating.film, but also silicon coating film that has excellent optical-electric properties by the ring-opening reaction caused by the optical treatment. In the case of a plastic substrate in particular, optical treatment is preferred to heat treatment. To convert the coating film of the cyclic silicon compound into the elementary silicon film, only either one or both of heat treatment and optical treatment may be carried out.

The light source used in the optical treatment may be a low-pressure or high-pressure mercury lamp, a deuterium lamp, discharge light of noble gases such as argon, krypton and xenon, a YAG laser, an argon laser, a carbon dioxide gas laser, and excimer lasers such as XeF, XeCl, XeBr, KrF, KrCl, ArF and ArCl. These light sources generally have an output of 10 to 5,000 W. An output of 100 to 1,000 W is generally sufficient. The wavelengths of these light sources are not limited to a particular range as long as they can be more or less absorbed by the coating films of the cyclic silicon compound and the optically ring-opened silicon compound but are preferably 170 nm to 600 nm. Further, the use of laser light is particularly preferable from the viewpoint of the efficiency of conversion into the silicon film. The temperature at which the optical treatment is carried out is preferably from room temperature to 500° C. and can be selected as appropriate according to the semiconducting properties of the obtained silicon film.

The first coating composition of the present invention can be prepared by the following process, which comprises:

(1) reacting at least one silicon compound represented by the following formula (1)-1:

wherein R is an aromatic group, $X^3$ is a halogen atom, and p is 0 or an integer of 1 to 4, with at least 1.5 equivalents of an alkali metal based on the halogen atoms in an ether-based solvent, (2) reacting the reaction product obtained in the step (1) with a hydrogen halide, and (3) reacting the reaction product obtained in the step (2) with $LiAlH_4$ in an ether-based solvent.

In the step (1), the silicon compound represented by the above formula (1)-1 is used. In the formula (1)-1, R is an aromatic group, $X^3$ is a halogen atom, and n is 0, 1, 2, 3 or 4.

Illustrative examples of the aromatic group include phenyl, tolyl, xylyl, α-naphthyl, β-naphthyl, α-thiophene and β-thiophene groups. Of these, a phenyl group is preferable from the viewpoint of the stability of the product obtained from the reaction with the alkali metal. Preferable examples of the halogen atom as $X^3$ include chlorine, bromine and iodine.

Illustrative examples of the silicon compound represented by the formula (1)-1 include tetrachlorosilane, phenyltrichlorosilane, diphenyldichlorosilane, triphenylchlorosilane, tetrabromosilane, phenyltribromosilane, diphenyldibromosilane, triphenylbromosilane, tetraiodosilane, phenyltriiodosilane, diphenyldiiodosilane and triphenyliodosilane. Of these, the above chlorosilanes are preferable from the viewpoints of availability of raw materials and the like. These silicon compounds can be used solely or in admixture of two or more.

In the step (1), the silicon compound of the above formula (1)-1 is reacted with an alkali metal and/or an alkaline-earth metal in an ether-based solvent. The solvent used in the step (1) of the present invention is an ether solvent. When the solvent is a hydrocarbon solvent that is generally used in Kipping reaction, the yield of a target soluble polysilane oligomer that is intended to be produced in the step (1) lowers. Illustrative examples of the ether solvent used in the step (1)-1 include diethyl ether, di-n-propyl ether, di-isopropyl ether, dibutyl ether, ethyl propyl ether, anisole, phenetole, diphenyl ether, diethylene glycol dimethyl ether, diethylene glycol diethyl ether, diethylene glycol dibutyl ether, diethylene glycol methylethyl ether, dipropylene glycol dimethyl ether, dipropylene glycol diethyl ether, dipropylene glycol dibutyl ether, dipropylene glycol methylethyl ether, ethylene glycol dimethyl ether, ethylene glycol diethyl ether, ethylene glycol dibutyl ether, ethylene glycol methylethyl ether, propylene glycol dimethyl ether, propylene glycol diethyl ether, propylene glycol dibutyl ether, propylene glycol methylethyl ether, tetrahydrofuran and dioxane. Of these, diethyl ether, tetrahydrofuran, ethylene glycol dimethyl ether and ethylene glycol diethyl ether are preferable because the above silicon compound shows good solubility to these solvents. It is desirable that water be removed from these ether solvents in advance. Water is preferably removed therefrom by deaeration distillation in the presence of sodium-benzophenone ketyl. The ether solvent is used in an amount of preferably 1 to 20 parts by weight, more preferably 3 to 7 parts by weight, based on 1 part by weight of the above silicon compound.

The alkali metal used in the step (1) is preferably lithium, sodium or potassium, for example. The alkaline earth metal is preferably magnesium or calcium. They are used in an amount of at least 1.5 equivalents based on the halogen atoms contained in the silicon compound to be reacted. When the amount of the alkali metal and/or the alkaline earth metal is smaller than 1.5 equivalents, the obtained polysilane compound is liable to be insoluble in the solvent, particularly in the reaction when a silane compound containing three or more halogen atoms is used as the above silane compound. Further, the reaction in the step (1) can be promoted by irradiating ultrasound from an outside source as,required. The ultrasound desirably has a frequency of about 10 to 70 KHz.

The reaction temperature in the step (1) is preferably −78° C. to +100° C. When the reaction temperature is lower than −78° C., the reaction proceeds slowly, thereby lowering productivity. On the other hand, when the reaction temperature is higher than +100° C., the reaction becomes complicated, whereby the solubility of the obtained polysilane lowers.

Then, in the step (2), the solvent-soluble polysilane compound obtained in the step (1) which has a specific substituent is treated with a hydrogen halide. The hydrogen halide used in the step (2) is preferably hydrogen chloride, hydrogen bromide or hydrogen iodide, for example. The solvent used in the step (2) can be any solvent that does not react with the polysilane compound obtained in the step (1). In the step (2), hydrocarbon solvents such as n-pentane, n-hexane, n-heptane, n-octane, decane, dicyclopentane, benzene, toluene, xylene, durene, indene, tetrahydronaphthalene, decahydronaphthalene and squalane can also be used, in addition to the ether solvents that are to be used in the step (1). These solvents can be used solely or in admixture of two or more.

The amount of the solvent used in the step (2) is preferably 3 to 10 parts by weight based on 1 part by weight of the reaction product obtained in the step (1). The reaction temperature in the step (2) is preferably −78° C. to +30° C. When the reaction temperature is lower than −78° C., the reaction proceeds slowly, thereby lowering productivity. On the other hand, when the reaction temperature is higher than +30° C., the solubility of the reaction product lowers, whereby the yield of the soluble polysilane oligomer lowers. In the reaction of the step (2), a catalyst can be used as required. The catalyst is preferably a Lewis acid catalyst, and aluminum chloride, aluminum bromide, ferric chloride and ferric bromide are preferably used, for example. These catalysts are used in an amount of preferably 0.001 to 0.1 part by weight based on 1 part by weight of the reaction materials.

In the step (2), the polysilane oligomer obtained in the step (1) which has a specific substituent is halogenated. In the step (3), the halogenated polysilane oligomer obtained in the step (2) is reduced with $LiAlH_4$ in an ether solvent. That is, in the reaction of the step (3), the halogen atoms of the halogenated polysilane oligomer obtained in the step (2) are reduced to hydrogen atoms. The amount of $LiAlH_4$ used in the step (3) is preferably 0.25 to 1 mole equivalent based on 1 equivalent of the halogen atoms of the halogenated polysilane oligomer. Further, the reduction reaction is preferably carried out in an inert gas such as argon or nitrogen at temperatures of 0 to 50° C. When the reaction temperature is lower than 0° C., the intended reaction proceeds slowly, thereby lowering productivity. On the other hand, when the reaction temperature is higher than 50° C., a side reaction is liable to occur, thereby lowering the yield of the solvent-soluble polysilane oligomer that is intended to be,produced, that is, the silicon compound represented by the above formula (1).

Next, a description will be given to the second coating composition of the present invention.

The modified silane compound used in the second coating composition of the present invention is represented by the above formula (2). In the formula (2), $X^2$ is a hydrogen atom or a halogen atom. The halogen atom is a fluorine atom, a chlorine atom, a bromine atom or an iodine atom, for example. A plurality, that is, m occurrences of $X^2$ may be the same as or different from one another. Y is a boron atom or a phosphorus atom. Since the modified silane compound contains a boron atom or a phosphorus atom as described above, a silicon film modified by the boron atom or the phosphorus atom can be obtained by thermally or optically decomposing the coating film of the second coating composition of the present invention in an inert or reducing gas atmosphere. In the formula, n is an integer of 3 or more, 1 is an integer of 1 or more, and m is an integer of n to 2n+3. When n is smaller than 3, it is difficult to form a good modified silane film by coating because the modified silane compound is in gaseous or liquid form. Illustrative examples of the compounds represented by the above formula (2) include the modified silane compounds represented by the following formulas.

The compounds represented by the above formula (2) can be further classified into four groups of compounds represented by the following formulas (2)-1, (2)-2, (2)-3 and (2)-4 according to the value of m.

$$Si_nX_{2n+1+2}Y_l \quad (2)\text{-}1$$

$$Si_nX_{2n+1}Y_l \quad (2)\text{-}2$$

$$Si_nX_{2n}Y_l \quad (2)\text{-}3$$

$$Si_nX_nY_l \quad (2)\text{-}4$$

In the above formulae, X, Y, n and l are defined in the same manner as in the formula (2).

Illustrative examples of the compounds represented by the above formula (2)-1 include $H_3Si$—$(SiH_2)_s$—$BH_2$ and $H_3Si$—$(SiH_2)_t$—$PH_2$, wherein s and t are independently an integer of 2 or more.

Illustrative examples of the compounds represented by the above formula (2)-2 include the following compounds 1, 2, 11 and 12.

Illustrative examples of the compounds represented by the above formula (2)-3 include the following compounds 3, 4, 5, 13, 14 and 15.

Illustrative examples of the compounds represented by the above formula (2)-4 include the following compounds 6, 7, 8, 9, 10, 16, 17, 18, 19 and 20.

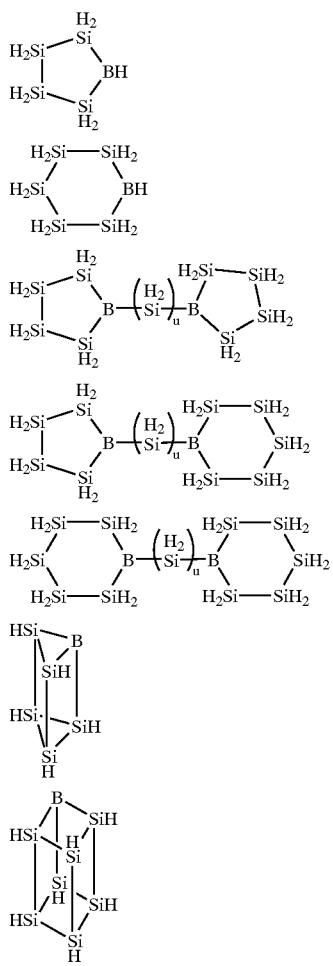

compound 1 compound 2 compound 3 compound 4 compound 5 compound 6 compound 7

-continued

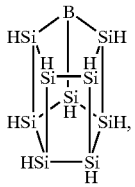

compound 8

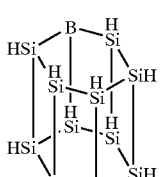

compound 9

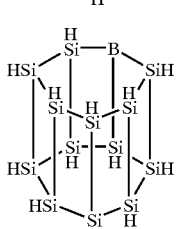

compound 10

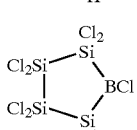

compound 11

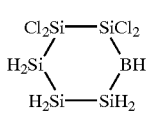

compound 12

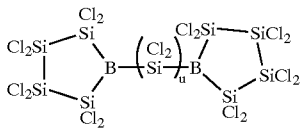

compound 13

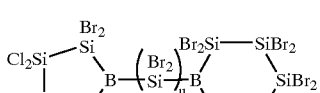

compound 14

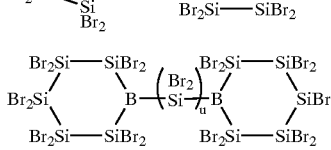

compound 15

compound 16

compound 17

-continued

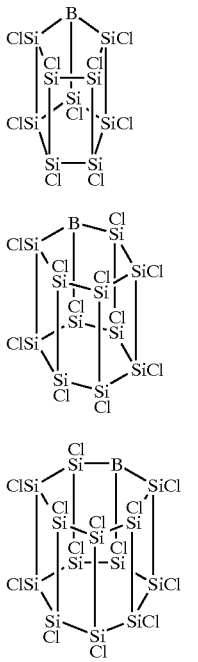

compound 18 compound 19 compound 20

Although only the boron-modified silane compounds have just been represented by the above formulas, the phosphorus-modified silane compounds that have the same skeletons as those of the boron-modified silane compounds can also be represented by the above formulas. In the case of the above compounds 3, 4, 5, 13, 14 and 15, u is a number of 0 to 10.

Of these silane compounds, the modified silane compound of the formula (2)-4 is preferable.

The above modified silane compounds used in the present invention can be generally produced using monomers such as silane halide, boron halide and phosphorus halide each of which has its own structural unit as raw materials, for example, by the following processes, which are (a) a process comprising polycondensing halogenated compounds by dehalogenation in the presence of an alkali metal (i.e., "Kipping process", refer to J. Am. Chem. Soc., 110, 124 (1988) and Macromolecules, 23, 3423(1990)), (b) a process comprising polycondensing halogenated compounds by dehalogenation under electrolytic reduction (refer to J. Chem. Soc., Chem. Commun., 1161(1990) and J. Chem. Soc., Chem. Commun., 897(1992)), and (c) a process comprising synthesizing a phenyl- or alkyl-substituted modified silicon compound by the above processes and deriving hydro-substitution product or halogen-substitution product thereof by conventional processes (for example, refer to Z. anorg. allg. Chem., 459, 123–130(1979)). Further, these halogenated cyclosilane compounds can be synthesized by conventional processes (for example, refer to E. Hengge et al. Mh. Chem. vol.106, p.503, 1975; E. Henggeetal., Z. Anorg. Allg. Chem. vol. 621, p.1,517, 1995; P. Boudjouk et al., J. Chem. Soc., Chem. Commun. P.777, 1984). By optimizing the synthesis condition, chlorinated compounds, hydrogenated compounds and partially chlorinated compounds can be produced.

The second coating composition of the present invention may contain unmodified silane compounds in addition to the modified silane compounds as described above. Illustrative examples of the unmodified silane compounds include hydrogenated silane compounds, halogenated silane compounds, and partially halogenated silane compounds. Specific examples thereof include halogenated cyclic silane compounds such as hexachlorocyclotrisilane, trichlorocyclotrisilane, octachlorocyclotetrasilane, tetrachlorocyclotetrasilane, decachlorocyclopentasilane, pentachlorocyclopentasilane, dodecachlorocyclohexasilane, hexachlorocyclohexasilane, tetradecachlorocycloheptasilane, heptachlorocycloheptasilane, hexabromocyclotrisilane, tribromocyclotrisilane, pentabromocyclotrisilane, tetrabromocyclotrisilane, octabromocyclotetrasilane, tetrabromocyclotetrasilane, decabromocyclopentasilane, pentabromocyclopentasilane, dodecabromocyclohexasilane, hexabromocyclohexasilane, tetradecabromocycloheptasilane and heptabromocycloheptasilane; hydrogenated cyclic silane compounds such as cyclotrisilane, cyclotetrasilane, cyclopentasilane, silylcyclopentasilane, cyclohexasilane, cycloheptasilane and cyclooctasilane; chain silane compounds such as n-pentasilane, i-pentasilane, neo-pentasilane, n-hexasilane, n-heptasilane, n-octasilane and n-nonasilane; and silane compounds having a spiro structure such as 1,1'-biscyclobutasilane, 1,1'-biscyclopentasilane, 1,1'-biscyclohexasilane, 1,1'-biscycloheptasilane, 1,1'-cyclobutasilylcyclopentasilane, 1,1'-cyclobutasilylcyclohexasilane, 1,1'-cyclobutasilylcycloheptasilane, 1,1'-cyclopentasilylcyclohexasilane, 1,1'-cyclopentasilylcycloheptasilane, 1,1'-cyclohexasilylcycloheptasilane, spiro[2.2]pentasilane, spiro[3.3]heptasilane, spiro[4.4]nonasilane, spiro[4.5]decasilane, spiro[4.6]undecasilane, spiro[5.5]undecasilane, spiro[5.6]undecasilane and spiro[6.6]tridecasilane. Of these, cyclopentasilane, silylcyclopentasilane, cyclohexasilane and cycloheptasilane are preferable from the viewpoints of the ease and stability of synthesis and purification.

The ratio of the unmodified silane compounds to the above modified silane compounds varies according to the content of a modifying element such as boron or phosphorous and is such that the ratio of the modifying element to a silicon atom is 1 ppb to 25 mol % (atom/atom).

The second coating composition of the present invention is a solution obtained by dissolving the above modified silane compound in a solvent. The solvent used in the present invention generally has a boiling point under atmospheric pressure of 30 to 350° C. When the boiling point of the solvent is lower than 30° C., the solvent evaporates first in the formation of the film by coating, thereby making it difficult to form a good coating film. On the other hand, when it is higher than 350° C., the solvent dries slowly, thereby making the solvent liable to remain in the coating film of the silane compound. Thus, it is difficult to form a good-quality modified silicon film even after the subsequent heat treatment and/or optical treatment.

The solvent used in the present invention can be any solvent that dissolves the modified silane compound and does not react with the modified silane compound. Illustrative examples of the solvent including preferable examples thereof are the same as those listed for the first coating composition of the present invention.

The second coating composition of the present invention comprises the above modified silane compound, and the unmodified silane compound as required, as solutes and the solvents as described above. The concentration of the solute is preferably 1 to 80 wt %, and the composition can be prepared as appropriate according to a desired coating process and a desired silicon film thickness. The viscosity of the thus-prepared modified-silane-compound-containing solution is preferably 1 to 500 mPa·s. When the viscosity is lower than 1 mPa·s, coating is difficult to carry out, while when it is higher than 500 mPa·s, it is difficult to obtain a coating film having a smooth surface.

The above solution may contain a fluoride-based, silicone-based or nonionic surface tension regulator as required in such a small amount that does not impair the objects and effects of the present invention. This nonionic surface tension regulator is useful for improving the wettability of the solution to the material to be coated and the leveling of the coating film and for preventing the occurrence of protrusions or orange peel on the coating film.

Illustrative examples of the nonionic surface tension regulator (surfactant) include a fluoride-based surfactant containing a fluoroalkyl group or perfluoroalkyl group or a polyether alkyl-based surfactant containing an oxyalkyl group. Illustrative examples of the above fluoride-based surfactant include $C_9F_{19}CONHC_{12}H_{25}$, $C_8F_{17}SO_2NH-(C_2H_4O)_6H$, $C_9F_{17}O(Pluronic\ L-35)C_9F_{17}$, $C_9F_{17}O(Pluronic\ P-84)C_9F_{17}$ and $C_9F_7O(Tetronic-704)(C_9F_{17})_2$ (Pluronic L-35: product of Asahi Denka Kogyo Co., Ltd., polyoxypropylene-polyoxyethylene block copolymer having an average molecular weight of 1,900; Pluronic P-84: product of Asahi Denka Kogyo Co., Ltd., polyoxypropylene-polyoxyethylene block copolymer having an average molecular weight of 4,200; Tetronic-704: product of Asahi Denka Kogyo Co., Ltd., N,N,N',N'-tetrakis (polyoxypropylene-polyoxyethylene block copolymer) having an average molecular weight of 5,000).

Specific examples of the fluoride-based surfactants include, presented by trade names, FTOP EF301, FTOP EF303 and FTOP EF352 (products of Shin Akita Kasei Co., Ltd.), MEGAFAC F171 and MEGAFAC F173 (products of Dainippon Ink and Chemicals, Incorporated), ASAHI GUARD AG710 (product of Asahi Glass Company), FLORADE FC-170C, FLORADE FC-430 and FLORADE FC-431 (products of SUMITOMO 3M LIMITED), SURFLON S-382, SURFLON SC101, SURFLON SC102, SURFLON SC103, SURFLON SC104, SURFLON SC105 and SURFLON SC106 (products of Asahi Glass Company), BM-1000 and BM-1100 (products of B.M-Chemie Co., Ltd.), and Schsego-Fluor (Schwegmann Co., Ltd.).

Illustrative examples of the polyether alkyl-based surfactant include polyoxyethylene alkyl ether, polyoxyethylene allyl ether, polyoxyethylene alkyl phenol ether, polyoxyethylene fatty acid ester, sorbitan fatty acid ester, polyoxyethylene sorbitan fatty acid ester and oxyethylene oxypropylene block polymer.

Specific examples of the polyether alkyl-based surfactants include, presented by trade names, EMALGEN 105, EMALGEN 430, EMALGEN 810, EMALGEN 920, REODOLE SP-40S, REODOLE TW-L120, EMANOLE 3199, EMANOLE 4110, EXEL P-40S, BRIDGE 30, BRIDGE 52, BRIDGE 72, BRIDGE 92, ARACEL 20, EMASOLE 320, TWEEN 20, TWEEN 60 and MERGE 45 (products of Kao Corporation), and NONIBOL 55 (product of Sanyo Chemical Industries, Ltd.). Further, nonionic surfactants other than those listed above can also be used. Illustrative examples of such surfactants include polyoxyethylene fatty acid ester, polyoxyethylene sorbitan fatty acid ester and polyalkyleneoxide block copolymer. Specific examples thereof include CHEMISTAT 2500 (product of Sanyo Chemical Industries, Ltd.), SN-EX9228 (SAN NOPCO LTD.) and NONALE 530 (Toho Chemical Industries Co., Ltd.). The nonionic surfactant is used in an amount of preferably 0.01 to 10 parts by weight, particularly preferably 0.1 to 5 parts by weight, based on 100 parts by weight of the total of the modified silicon compound and the solvent. When the amount is less than 0.01 parts by weight, the effect of the nonionic surfactant is not exhibited. On the other hand, when it is larger than 10 parts by weight, the obtained composition is liable to foam and may be thermally discolored disadvantageously. Specific examples of the above surfactants and their amounts can also be applied to the above first coating composition of the present invention.

The second coating composition of the present invention is not ion-implanted into a silicon film in a vacuum system as has been practiced heretofore. Instead, the solution containing the modified silane compound is coated on a substrate, the solvent is then dried to form a modified silane compound film, the modified silane compound film is thermally and/or optically decomposed to covert it into a boron or phosphorous atom-modified silicon film. To coat the above modified silane compound solution, such methods as spin coating, roll coating, curtain coating, dip coating, spray coating and ink-jet coating can be employed. The coating is generally carried out at temperatures higher than or equal to room temperature. When the temperature is lower than room temperature, the solubility of the modified silane compound lowers, whereby the compound may be partially precipitated. As for the atmosphere under which the coating is carried out, an inert gas such as nitrogen, helium or argon is preferable. Preferably, the atmosphere may further contain a reducing gas such as hydrogen as required. The rotation speed of a spinner when spin coating is used is determined according to the thickness of the thin film to be formed and the composition of the coating solution and is generally 100 to 5,000 rpm, preferably 300 to 3,000 rpm. After the coating, heat treatment is carried out to remove the solvent. The heating temperature varies according to the kind and boiling point of the solvent used and is generally 100 to 200° C. As for the atmosphere, the heat treatment is preferably carried out in an inert gas such as nitrogen, helium or argon as in the case of the above coating step.

The second coating composition of the present invention is coated to form the coating film of the above modified silane compound, and the coating film is subjected to heat treatment and/or optical treatment to convert it into a modified silicon film. The thus obtained modified silicon film is amorphous or polycrystalline. In the above thermal treatment, when the reached temperature is generally not more than about 550° C., an amorphous modified silicon film is obtained, while when it is higher than that, a polycrystalline modified silicon film is obtained. When an amorphous modified silicon film is desired to be obtained, the temperature is preferably 300 to 550° C., more preferably 350 to 500° C. When the reached temperature is lower than 300° C., the thermal decomposition of the modified silane compound does not fully proceed, whereby a modified silicon film having satisfactory properties may not be formed. The atmosphere under which the above heat treatment is carried out is preferably an inert gas such as nitrogen, helium or argon or the inert gas mixed with a reducing gas such as hydrogen.

The light source used in the above optical treatment, may be a low-pressure or high-pressure mercury lamp, a deuterium lamp, discharge light of noble gases such as argon, krypton and xenon, a YAG laser, an argon laser, a carbon dioxide gas laser, and excimer lasers such as XeF, XeCl, XeBr, KrF, KrCl, ArF and ArCl. These light sources generally have an output of 10 to 5,000 W. An output of 100 to 1,000 W is generally sufficient. The wavelengths of these light sources are not limited to a particular range as long as they can be more or less absorbed by the modified silicon compound. They are generally 170 to 600 nm. Further, the use of laser light is particularly preferable from the viewpoint of the efficiency of conversion into the modified silicon film. The temperature at which the optical treatment is carried out is generally from room temperature to 500° C. and can be selected as appropriate according to the semiconducting properties of the obtained modified silicon film. Particularly when a polycrystalline modified silicon film is desired to be obtained, it can be obtained by converting the amorphous modified silicon film obtained above to a polycrystalline silicon film by irradiating it with the above light.

The substrate on which the second coating composition of the present invention is coated is not particularly limited in kind. As the substrate, there can be preferably used glass substrates such as quartz, borosilicate glass and soda glass; metal substrates such as gold, silver, copper, nickel, titanium, aluminum, tungsten and silicon; and glass and plastic substrates covered with these electrically conductive metals or a electrically conductive metal oxide film such as ITO.

EXAMPLES

The present invention will be described in detail with reference to the following Examples. The present invention, however, shall not be limited to these Examples in any way.

Synthesis Example 1

The inside of a 3-liter four-neck flask equipped with a thermometer, a condenser, a dropping funnel and an agitator was substituted with an argon gas, 2 liters of dried tetrahydrofuran and 75 g of metal lithium were charged into the flask, and the content of the flask was bubbled with an argon gas. While this suspension was agitated at 0° C., 500 g of phenyltrichlorosilane was added through the dropping funnel. The reaction was continued at 0° C. until the metal lithium completely disappeared and, thereafter, the content of the flask was further agitated at room temperature 12 hours. The dark-brown reaction mixture was poured into ice water to precipitate the reaction product. This precipitate was separated by filtration, washed fully with water and vacuum dried to give 210 g of a light-yellow polycyclic silicon compound containing a phenyl group.

A hundred fifty grams of the phenyl group-containing polycyclic silicon compound obtained by the above reaction was caused to be suspended in 2 liters of toluene, 5 g of aluminum chloride was added thereto, and a dried hydrogen chloride gas was then introduced to the reaction system until the system became transparent. After the completion of the reaction, the aluminum compound was removed therefrom. Thereafter, the solvent was separated by distillation under reduced pressure to give 85 g of the crude product of the chlorinated polycyclic silicon compound from which the phenyl group had been removed. This chlorinated compound, without purifying it, was dissolved in a mixed solvent of 250 ml of diethyl ether and 250 ml of toluene in an argon atmosphere. Fifteen grams of lithium aluminum hydride was added to the resulting mixture while the mixture was agitated at 0° C. The mixture was agitated for another 3 hours. Thereafter, the mixture was gradually heated to room temperature and agitated for another 6 hours. The aluminum compound was separated from the reaction mixture by filtration, and the filtrate was condensed and purified to give 21 g of the target hydrogenated polycyclic silicon compound. As a result of analyzing this polycyclic silicon compound, its main composition was a mixture of $Si_nH_n$ wherein n was 6, 8, 10, 12 or 14. Of these, the mass spectrum of hexasila[3]prismane(n=6), which is the most predominant component, is shown in FIG. 1.

Synthesis Example 2

In the same manner of Synthesis Example 1, the inside of a 3-liter four-neck flask equipped with a thermometer, a condenser, a dropping funnel and an agitator was substituted with an argon gas, 2 liters of dried tetrahydrofuran and 63 g of metal lithium were charged into the flask, and the content of the flask was bubbled with an argon gas. While this suspension was agitated at −30° C., a mixture of 253 g of diphenyldichlorosilane and 170 g of tetrachlorosilane was added through the dropping funnel. The reaction was continued until the metal lithium completely disappeared. Thereafter, the filtrate obtained by separating the unreacted lithium by filtration was poured into ice water to precipitate the reaction product. This precipitate was separated by filtration, washed fully with water and vacuum dried to give 210 g of a phenyl group-containing polycyclic silicon compound.

Two hundred and ten grams of the phenyl group-containing polycyclic silicon compound obtained from the above reaction was caused to be suspended in 2 liters of toluene, 10 g of aluminum chloride was added thereto, and a dried hydrogen chloride gas was then introduced to the reaction system until the system became a transparent solution. After the completion of the reaction, the aluminum compound was removed therefrom. Thereafter, the solvent was separated by distillation under reduced pressure to give 120 g of the crude product of the chlorinated polycyclic silicon compound from which the phenyl group had been removed. This chlorinated compound, without purifying it, was dissolved in a mixed solvent of 800 ml of diethyl ether and 800 ml of toluene in an argon atmosphere. Nineteen grams of lithium aluminum hydride was added to the resulting mixture while the mixture was agitated at 0° C. The mixture was agitated for another 3 hours. Thereafter, the mixture was gradually heated to room temperature and agitated for another 6 hours. The aluminum compound was separated from the reaction mixture by filtration, and the filtrate was condensed to give 60 g of the target hydrogenated polycyclic silicon compound. As a result of analyzing this polycyclic silicon compound, its main composition was a mixture of $Si_nH_n$ wherein n was 6, 8, 10, 12 or 14.

Example 1

Figure 2:
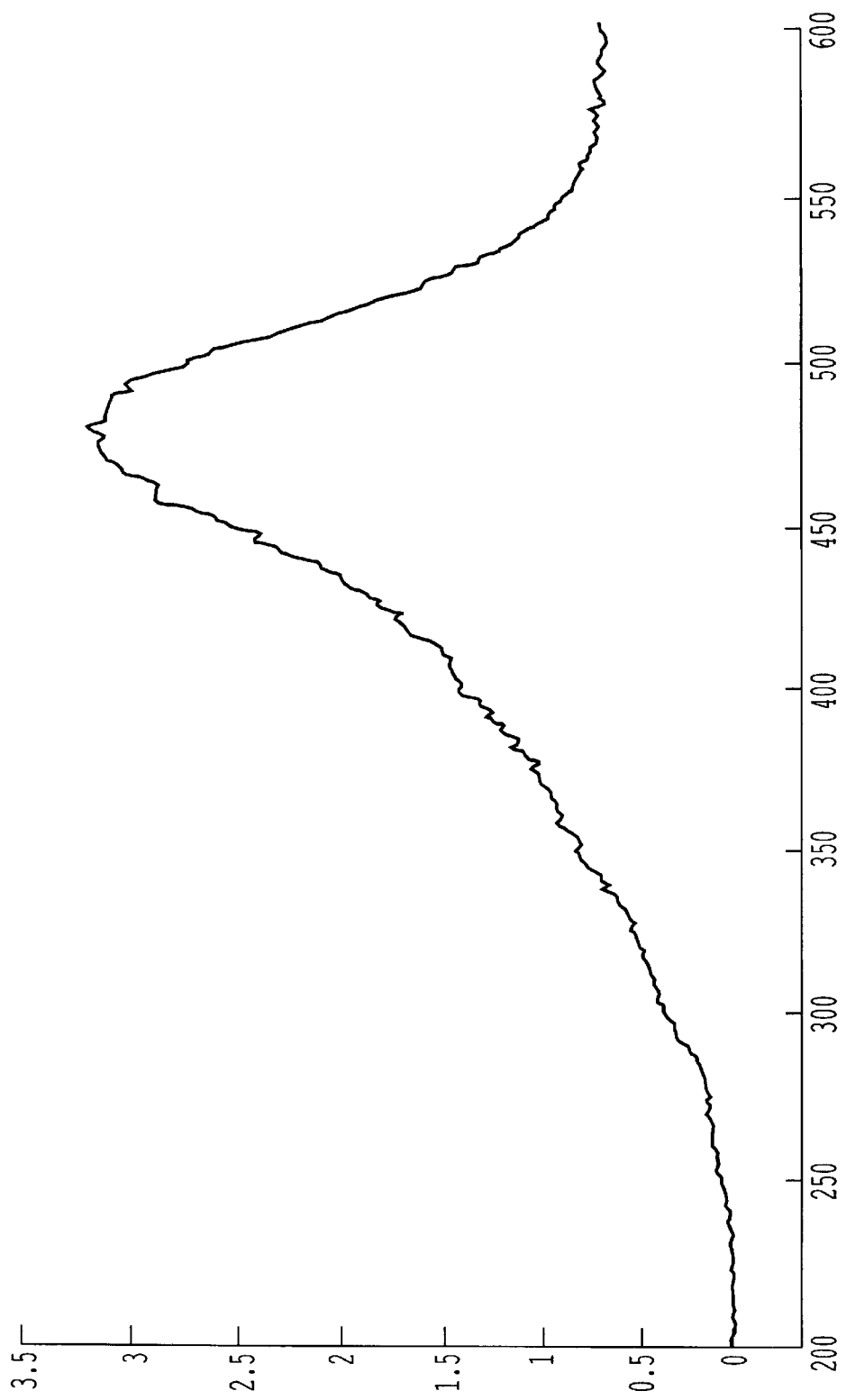
FIG. 2 shows the Raman spectrum of the silicon film obtained in Example 1 of the present invention.

A solution was prepared by dissolving 10 g of the hydrogenated polycyclic silicon compound obtained in Synthesis Example 1 in 10 ml of toluene. This solution was spin-coated on a substrate at 1,500 rpm in an argon atmosphere, and the solvent was removed at 100° C. to form a coating film of the hydrogenated polycyclic silicon compound. Then, when this coating film was subjected to heat treatment at 500° C. for 30 minutes in an argon atmosphere, it was converted into a silicon film having metal gloss. When the Raman spectrum of this silicon film was measured, it was 100% amorphous. The measured Raman spectrum is shown in FIG. 2.

Example 2

A coating solution prepared by dissolving 10 g of the hydrogenated polycyclic silicon compound obtained in Synthesis Example 1 in 30 ml of xylene was pattern-coated on a quartz substrate in an argon atmosphere. After this substrate was dried at 200° C. in an argon atmosphere containing 5% of hydrogen, it was irradiated with an excimer laser having a wavelength of 308 nm to give a good silicon film pattern having a film thickness of 850 angstrom. When the Raman spectrum of this silicon film was measured, the silicon film was a polycrystalline silicon film having a crystallinity of 80%.

Example 3

A solution was prepared by dissolving 5 g of the hydrogenated polycyclic silicon compound obtained in Synthesis Example 2 in 10 g of toluene. This solution had a viscosity of 11 mPa·s. This solution was pattern-coated on a quartz substrate in an argon atmosphere by using an ink-jet head comprising a piezoelectric element. This substrate was dried at 150° C. in an argon atmosphere and then thermally decomposed at 500° C. to give a silicon film having a film thickness of 800 angstrom. When this silicon film was subjected to surface composition analysis by ESCA, only silicon atoms were detected. Further, when the crystallinity of this silicon film by the Raman spectrum was measured, it was 100% amorphous.

Example 4

A solution was prepared in the same manner as in Example 1 except that tetrahydronaphthalene was used in place of toluene used as the solvent in Example 1. This solution ink was pattern-coated on a quartz substrate in an argon atmosphere by using an ink-jet head comprising a piezoelectric element. This substrate was dried at 150° C. in an argon atmosphere containing 5% of hydrogen, then thermally decomposed at 500° C., and irradiated with ultraviolet light from a 500-W high-pressure mercury lamp for 10 minutes to give a silicon film having a film thickness of 650 angstrom. When this silicon film was subjected to surface composition analysis by ESCA, only silicon atoms were detected. Further, when the crystallinity of this silicon film by the Raman spectrum was measured, it was 100% amorphous.

Example 5

The pattern coating was conducted on a polyimide film substrate in the same manner as in Example 1 except that a solution obtained by dissolving 5 g of the hydrogenated polycyclic silicon compound obtained in Synthesis Example 2 in a mixed solvent of 7 g of toluene and 3 g of diethylene glycol diethyl ether was used to spin coated on the substrate which was a polyimide film substrate. This substrate was dried at 150° C. in an argon atmosphere and then optically and thermally decomposed at 350° C. while exposed to a 500-W high-pressure mercury lamp to give a silicon film having a film thickness of 800 angstrom. When this silicon film was subjected to surface composition analysis by ESCA, only silicon atoms were detected. Further, when the crystallinity of this silicon film by the Raman spectrum was measured, it was 100% amorphous.

Example 6

The 100%-amorphous silicon film obtained in Example 5 was irradiated with an excimer laser having a wavelength of 308 nm in an argon atmosphere. When the Raman spectrum was measured again, it was a polycrystalline silicon film having a crystallinity of 65%.

Synthesis Example 3

The inside of a 1-liter four-neck flask equipped with a thermometer, a condenser, a dropping funnel and an agitator was substituted with an argon gas, 500 ml of dried tetrahydrofuran and 13 g of metal lithium were charged into the flask, and the content of the flask was bubbled with an argon gas. While this suspension was agitated at room temperature, a mixture of 106 g of phenyltrichlorosilane and 25 g of boron tribromide was added through the dropping funnel. The reaction was continued until the metal lithium completely disappeared and, thereafter, the reaction mixture was poured into ice water to precipitate the reaction product. This precipitate was separated by filtration, washed fully with water and then with cyclohexane, and vacuum dried to give 50 g of a phenyl group-containing boron-modified silicon compound. Fifty grams of the boron-modified silicon compound was dissolved in 500 ml of toluene, 2 g of aluminum chloride was added thereto, and a dried hydrogen chloride gas was then introduced thereto until the material disappeared. After the completion of the reaction, the aluminum compound was removed therefrom. Thereafter, the solvent was separated by distillation under reduced pressure to give 25 g of the chlorinated compound. This 25 g of chlorinated compound, without purifying it, was dissolved in a mixed solvent of 250 ml of ether and 250 ml of toluene in an argon atmosphere. Six grams of lithium aluminum hydride was added to the resulting mixture while the mixture was agitated and cooled with ice. The mixture was agitated for another 3 hours. After the aluminum compound was separated from the reaction mixture, the remaining mixture was condensed to give 10 g of the target modified silicon compound mixture. As a result of elementary analysis, it was found to be $Si_5H_5B$.

Synthesis Example 4

As in Synthesis Example 3, the inside of a 1-liter four-neck flask equipped with a thermometer, a condenser, a dropping funnel and an agitator was substituted with an argon gas, 500 ml of dried tetrahydrofuran and 9 g of metal lithium were charged into the flask, and the content of the flask was bubbled with an argon gas. While this suspension was agitated at room temperature, a mixture of 126 g of diphenyldichlorosilane and 25 g of boron tribromide was added through the dropping funnel. The reaction was continued until the metal lithium completely disappeared and, thereafter, the reaction mixture was poured into ice water to precipitate the reaction product. This precipitate was separated by filtration, washed fully with water and dried to give 90 g of a phenyl group-containing boron-modified silane compound. Ninety grams of the modified silane compound was dissolved in 500 ml of toluene, 4 g of aluminum chloride was added thereto, and a dried hydrogen chloride gas was then introduced to the resulting mixture, while the mixture was cooled with ice, until the material disappeared. After the completion of the reaction, the aluminum compound was removed therefrom. Thereafter, the modified silane compound was converted into a chloro group-containing boron-modified silane compound. This chlorinated compound, without purifying it, was dissolved in a mixed solvent of 250 ml of ether and 250 ml of toluene in an argon atmosphere. Twelve grams of lithium aluminum hydride was added to the resulting mixture while the mixture was agitated and cooled with ice, and the mixture was agitated for another 3 hours. After the aluminum compound was separated from the reaction mixture, the remaining mixture was condensed and purified to give 10 g of the target modified silicon compound mixture. As a result of elementary analysis, it was found to be $Si_5H_{11}B$.

Synthesis Example 5

A phosphorous-modified silicon compound mixture was obtained in the same manner as in Synthesis Example 1 except that 27 g of phosphorus tribromide was used in place of 25 g of boron tribromide used in the above Synthesis Example 3. As a result of elementary analysis, it was found to be $Si_5H_5P$.

Synthesis Example 6

A phosphorous-modified silicon compound mixture was obtained in the same manner as in Synthesis Example 3 except that 27 g of phosphorus tribromide was used in place of 25 g of boron tribromide used in the above Synthesis Example 4. As a result of elementary analysis, it was found to be $Si_5H_{11}P$.

Example 7

A coating solution was prepared by dissolving 3 g of the boron-modified silicon compound mixture obtained in Synthesis Example 3 in 10 ml of toluene. This solution had a viscosity of 6 mPa·s. This solution was spin-coated on a quartz substrate in an argon atmosphere, dried at 150° C. and then thermally decomposed in an argon atmosphere at 500° C. to give a silicon film having a film thickness of 650 angstrom. When this silicon film was subjected to surface composition analysis by ESCA, only silicon atoms and boron atoms were detected, and their ratio was 5:1. Further, when the crystallinity of this silicon film by the Raman spectrum was measured, it was 100% amorphous.

Example 8

A coating solution was prepared by dissolving 1 g of the boron-modified silicon compound mixture obtained in Synthesis Example 3 and 10 g of cyclohexasilane in 30 g of tetrahydronaphthalene. This solution had a viscosity of 10 mPa·s. This solution was dip-coated on a quartz substrate in an argon atmosphere and dried at 200° C. to give a good film. When this substrate was heat-treated as in Example 7, the film was converted into a silicon film. When this silicon film was subjected to surface composition analysis by ESCA, only silicon atoms and boron atoms were detected, and their ratio was 50:1. Further, when the crystallinity of this silicon film by the Raman spectrum was measured, it was 100% amorphous.

Example 9

When the 100% amorphous silicon film obtained by thermal decomposition in Example 8 was further heated to 800° C. in an argon atmosphere, a sharp peak was observed at 520 cm$^{-1}$ by the Raman spectrum. As a result of analysis, it was a polycrystalline silicon film having a crystallinity of 50%.

Example 10

A coating solution was prepared by dissolving 1 g of the phosphorous-modified silane compound mixture obtained in Synthesis Example 5 and 10 g of cyclohexasilane in 25 g of toluene. This solution had a viscosity of 8.5 mPa·s. This solution was spin-coated on a quartz substrate on which gold had been vapor-deposited in an argon atmosphere and dried at 150° C. to give a good film. When this substrate was heat-treated as in Example 7, the film was converted into a silicon film. When this silicon film was subjected to surface composition analysis by ESCA, only silicon atoms and phosphorous atoms were detected, and their ratio was 50:1. Further, when the crystallinity of this silicon film by the Raman spectrum was measured, it was 100% amorphous.

Example 11

A coating solution was prepared by dissolving 1 g of the silane compound obtained in Synthesis Example 6 in a mixed solvent of 3 g of toluene, 3 g of xylene and 3 g of tetrahydronaphthalene. This solution had a viscosity of 11 mPa·s. This solution was spin-coated on a quartz substrate in an argon atmosphere, dried at 200° C., and irradiated with ultraviolet light from a 500-W high-pressure mercury lamp for 30 minutes while heated to 300° C. in an argon atmosphere, to give a silicon film having a film thickness of 350 angstrom. When this silicon film was subjected to surface composition analysis by ESCA, only silicon atoms and phosphorous atoms were detected, that is, no other atoms were detected. Further, when the crystallinity of this silicon film by the Raman spectrum was measured, it was 100% amorphous.

As described above, according to the present invention, a silicon film or a modified silicon film can be formed by a novel coating process different from conventional silicon film-forming processes. Thus, when the first coating composition is used, the material is not deposited from a vapor phase as in conventional CVD but the material in a liquid phase is coated and can be then converted into a silicon film as an electron material by thermal and/or optical energy. Further, when the second coating composition of the present invention is used, unlike the deposition from a vapor phase as in conventional CVD or the ion injection in a vacuum, the material in a liquid phase is coated and can be then converted into a modified silicon film by thermal and/or optical energy.

That is, when the first or the second coating composition is used, unlike conventional CVD, the generation of particles at the time of forming the silicon film can be prevented, expensive apparatus are not required because a large-scale vacuum process is not used, and a film can be formed easily even on a substrate having a large area. Further, the modified silicon film pattern can be formed by partial coating without going through photolithography and etching processes. Therefore, semiconductor devices such as LSI, thin-film transistor, photoelectric converter and photosensitive which have the modified silicon film can be produced by an energy-efficient process.

What is claimed is:

1. A coating composition comprising a silicon compound represented by the following formula (1):

$$Si_nX^1_n \qquad (1)$$

wherein $X^1$ is a hydrogen atom or a halogen atom, and n is an integer of 4 or more, on the proviso that n occurrences of $X^1$ may be the same as or different from one another, and solvent thereof.

2. The coating composition of claim 1, wherein the silicon compound represented by the formula (1) is a polycyclic silicon compound.

3. The coating composition of claim 1, wherein the solvent is selected from the group consisting of a hydrocarbon solvent, an ether solvent and an aprotic solvent.

4. The coating composition of claim 1, wherein the silicon compound is contained in an amount of 1 to 80 wt % based on the coating composition.

5. The coating composition of claim 1, which further contains at least one of silane compound which is selected from the group consisting of a hydrogenated silane compound, a halogenated silane compound and a partially halogenated silane compound and is different from the modified silane compound.

6. A coating composition comprising a modified silane compound represented by the following formula (2):

$$Si_nX^2_mY_l \qquad (2)$$

wherein $X^2$ is a hydrogen atom or a halogen atom, Y is a boron atom or a phosphorus atom, n is an integer of 3 or more, l is an integer of 1 or more, and m is an integer of n to 2n+3, on the proviso that m occurrences of $X^2$ may be the same as or different from one another, and solvent thereof.

7. The coating composition of claim 6, wherein the modified silane compound represented by the formula (2) is at least one compound selected from the group consisting of modified silane compounds represented by the following formulas (2)-1, (2)-2, (2)-3 and (2)-4:

$$Si_nX_{2n+1+2}Y_l \qquad (2)\text{-}1$$

$$Si_nX_{2n+1}Y_l \qquad (2)\text{-}2$$

$$Si_nX_{2n}y_1 \qquad (2)\text{-}3$$

$$Si_nX_nY_l \qquad (2)\text{-}4$$

wherein X, Y, n and l are the same as defined in the formula (2).

8. The coating composition of claim 6, wherein the solvent is selected from the group consisting of a hydrocarbon solvent, an ether solvent and an aprotic solvent.

9. The coating composition of claim 6, wherein the modified silicon compound is contained in an amount of 1 to 80 wt % based on the coating composition.

* * * * *